United States Patent [19]

Stork

[11] Patent Number: 4,785,698
[45] Date of Patent: Nov. 22, 1988

[54] SEPARATING DEVICE FOR PLATES

[75] Inventor: Martin Stork, Muehlheim, Fed. Rep. of Germany

[73] Assignee: Hoechst Aktiengesellschaft, Frankfurt am Main, Fed. Rep. of Germany

[21] Appl. No.: 921,486

[22] Filed: Oct. 22, 1986

[30] Foreign Application Priority Data

Oct. 26, 1985 [DE] Fed. Rep. of Germany ....... 3538117

[51] Int. Cl.$^4$ .......................... B26D 5/04; B26D 5/28
[52] U.S. Cl. ......................................... 83/368; 83/318; 83/319; 83/364; 83/365; 83/371; 83/614; 83/620; 83/461
[58] Field of Search ...................... 83/32, 72, 289, 318, 83/368, 564, 365, 370, 371, 614, 620

[56] References Cited

U.S. PATENT DOCUMENTS

| | | | |
|---|---|---|---|
| 3,072,004 | 1/1963 | Jenkins | 83/318 |
| 3,133,850 | 5/1964 | Alenius | 156/299 |
| 3,620,887 | 11/1971 | Nelson | 156/299 |
| 3,717,058 | 2/1973 | McMinn | 83/365 |
| 3,837,246 | 9/1974 | Juditzki | 83/318 |
| 3,978,749 | 9/1976 | Polenz | 83/614 |
| 4,214,936 | 7/1980 | Del Bianco | 156/302 |
| 4,329,896 | 5/1982 | Singer | 83/371 |
| 4,444,077 | 4/1984 | Wise et al. | 83/319 |
| 4,527,750 | 7/1985 | Juntti | 83/614 |

FOREIGN PATENT DOCUMENTS 0040842 12/1981 European Pat. Off. .
0040843 12/1981 European Pat. Off. .
0041642 12/1981 European Pat. Off. .

Primary Examiner—Frank T. Yost
Assistant Examiner—Scott A. Smith
Attorney, Agent, or Firm—Foley & Lardner, Schwartz, Jeffery, Schwaab, Mack, Blumenthal & Evans

[57] ABSTRACT

A continuous strip which is laminated onto plates arranged at a distance from one another and which is composed of a dry resist laminate is introduced into a separating device 1 extending over the width of a strip 20. A drive cylinder 2 is arranged by means of pillars 3 above a carriage 31. The drive cylinder 2 guides the mounting 11, in which a cross-cutting device 10 is fastened, transversely over the strip 20. The cross-cutting device 10 comprises two knife-holders with knives parallel to one another, which are movable apart from one another and together and which, during the transverse movement, sever the strip 20 in a double cut along the trailing edge 29 and the leading edge 30 of two adjacent plates 4 and 5.

18 Claims, 2 Drawing Sheets

SEPARATING DEVICE FOR PLATES

BACKGROUND OF THE INVENTION

The invention relates to a separating device for plates which are arranged at a distance from one another and onto which at least one continuous strip composed of a dry resist layer has been laminated.

Published European Patent Applications Nos. 0,040,842, 0,040,843 and 0,041,642 make known laminating processes in which a substrate or a layer support is laminated with a dry resist on both sides by means of applied pressure. The dry resist to be applied to each side of the layer support to be laminated, for example, a printed circuit board is drawn off from a supply roll and fed to a pair of laminating rollers. Two dry resist films with the layer support located between them run through the nip of the rollers. Before lamination, a thin liquid layer is coated onto the surface of the layer support or printed circuit board and forms an intermediate layer between the surface of the printed circuit board and each respective dry resist film during the laminating operation. The thin liquid layer is removed from the surface of the printed circuit board during lamination by being absorbed into the dry resist film. After lamination, the layer support is provided on both sides with a dry resist layer, so that both sides of the layer support, usually a printed circuit board or printing plate, can be exposed and developed.

U.S. Pat. No. 4,214,936 teaches a laminating process in which horizontally transported plates are moved continuously forward, are contact-heated, and are laminated on both sides. As soon as a sensor detects the trailing edge of the preheated plate, shortly before it enters the nip between the laminating rollers, the rollers are stopped after a certain delay time. This makes it possible for the trailing edge of the plate to pass through the laminating nip. As soon as the leading edge of the following plate is detected, the laminating rollers start to rotate once again, and the plate entering the nip is laminated. This operation is repeated for each new plate, and a uniform distance is therefore maintained between the individual laminated plates after the nip. At the same time, a continuous strip is obtained. This is composed of two dry resist layers, between which the plates are included at an equal distance from one another. The connecting length of the resist layers between two plates can amount, for example, up to 18 mm. A disadvantage here is that separating the plates from one another requires two cutting operations, first to cut off the connecting piece composed of the dry resist along the trailing edge of the front plate and subsequently to cut along the leading edge of the rear plate. Often, even three cutting operations are required, since, during the first cut, only the connecting piece between two plates is initially severed, and only subsequently is the individual plate processed by cutting off the dry resist layer flush with the plate edge that projects beyond the leading or trailing edge. This is done as late as during the finishing of the individual plate.

SUMMARY OF THE INVENTION

The object of the invention is to improve a separating device of the type described in the introduction, in such a way that, in a single cutting operation, successive connected plates are separated from one another, and at the same time the dry resist laminate connecting the plates to one another is cut off flush with the plate edges along the trailing and leading edges of successive plates.

According to the invention, this object is achieved when the separating device extending over the width of the strip comprises a carriage, over which the strip together with the plates is guided, a cylinder mounting which is fastened on the carriage and is composed of pillars and which is intended for a drive cylinder, a mounting connected to the drive cylinder intended for a cross-cutting means, and a cross-cutting means, and in that the separating device is movable back and forth in a longitudinal direction in relation to the strip and that the mounting together with the cross-cutting means fastened to it is movable back and forth in a transverse direction in relation to the strip.

In a further embodiment of the invention, the cross-cutting means has two knife-holders with the knives parallel to one another, which can be moved apart from one another and together and which, during the transverse movement of the cross-cutting means, sever the strip simultaneously along the trailing edge and leading edge of two adjacent plates.

The invention achieves the advantages that the plate are finished as early as during the separating operation, that is to say in the course of a double cut the dry resist laminate between the plates is cut along the leading and trailing edges flush with the edges and that differing distances between successive plates can be taken into account automatically during the double cut by moving the knife-holders apart until the knives come up against the plate edges.

The invention is explained in detail below with reference to the exemplary embodiment illustrated in the drawings.

DETAILED DESCRIPTION OF THE PREFERRED EMBODIMENTS

Figure 1:
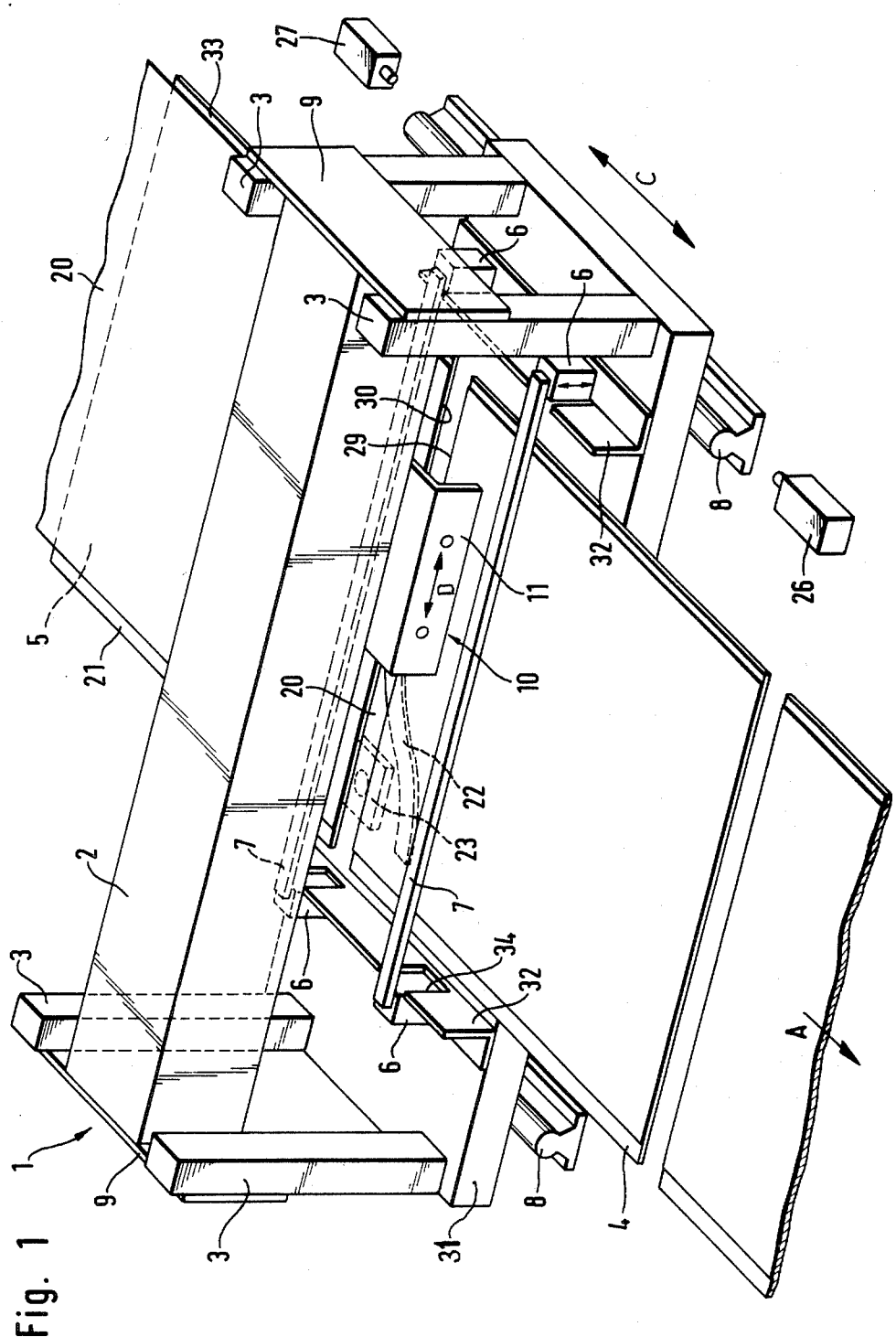
FIG. 1 is a diagrammatic perspective view of the separating device according to the invention.

The separating device 1 illustrated in FIG. 1 comprises a carriage 31, on which is fastened a cylinder mounting composed of pillars 3 for a drive cylinder 2 extending over and beyond the width of a strip 20. The drive cylinder 2 is connected to a mounting 11 for a cross-cutting means 10 (see FIG. 2) which is fastened in the mounting 11. The strip 20 is composed of a continuous dry resist layer or a dry layer laminate which is laminated onto plates 4 and 5 in a laminating apparatus (not shown) by means of applied pressure and heat. Conventionally, both the top sides and undersides of the plates 4 and 5 are each laminated with a continuous strip of dry resist layer or photoresist layer. The separating device 1 extends over and beyond the width of the strip 20 which does not cover the full width of the plates 4 and 5, but leaves free a relatively wide margin 21 and relatively narrow margin 33 of the plates.

The separating device 1 is movable back and forth, as shown by double arrow C, in a longitudinal direction relative to the strip 20, which moves in the running direction A. The mounting 11 together with the cross-cutting means 10 fastened to it is movable back and forth, as shown by double arrow D, in a transverse direction relative to the strip 20, as will be described in more detail below.

The end faces of the drive cylinder 2 are connected to fastening plates 9, 9 which are fastened to the pillars 3 of the cylinder mounting. The drive cylinder 2 is, for example, a known pneumatic cylinder without a piston rod, with its band drive damped adjustably on both sides. The stroke speed of the drive cylinder should not exceed 1.5 m/sec., since otherwise the wear increases sharply with increasing speed. The guided part to be driven, in the present case the mounting 11 with the cross-cutting means 10, is pulled by the steel band (not shown) of the drive cylinder 2. When the drive cylinder 2 is connected and the damping means adjusted, it is necessary to ensure that the piston and the slide run in opposite directions. The damping means is designed so that, when the driven and guided mounting 11 is positioned, a possible overtravel is taken into account, which depends on the stroke speed and switching time of the drive cylinder 2, at any convenient time. In a known drive cylinder 2, for example at a stroke speed of 500 mm/sec. with a switching time of 20 msec., an overtravel of 10 mm is obtained. Variations of ±1 msec. in the switching time reduce the repeating accuracy by ±0.5 mm. Since it is scarcely possible to avoid variations in the switching time, the drive cylinder 2 is operated so that damping starts shortly before its holding position and the steel band of the drive cylinder 2 is moved onto its holding position at a so-called creep speed.

The carriage 31 of the separating device 1 rests on linear spherical guides 8, 8—for example, cylindrically shaped guides—on both sides, parallel to the running direction A of the strip and is moved to and fro by means of a motor (not shown).

FIG. 1 shows a first limit switch 26 near the front end of the right-hand spherical guide 8 and a second limit switch 27 near the rear end face of the spherical guide. The first limit switch 26 is actuated by the end face of the carriage 31, when the separating device 1 is moved out of its initial position in the running direction A of the strip 20. This limit switch 26 triggers holding-down means 6, 6 which lift the holding-down bars 7, 7 off from the covering surface of the carriage. At the same time, the direction of rotation of the motor driving the separating device 1 is also reversed, and the separating device is moved counter to the running direction A, until the separating device 1 has reached its initial position and actuates the second limit switch 27 which stops the motor and clears a first sensor 23 which can be, for example, an optoelectric element comprising a photodiode, phototransistor and photoresistor in combination with optics and a light source, so that the sensor 23 can register the trailing edge 29 of the plate 4 and the leading edge 30 of the plate 5 again. In FIG. 1, the sensor 23 is indicated by broken lines near the margin 21 of the strip 20 in the region of the cross-cutting means. In FIG. 1, after the double cut has been made, the mounting 11 of the cross-cutting means moves along the trailing edge 29 and the leading edge 30 towards the right-hand margin 33 of the plates 4 and 5. During the double cut, the waste shred 22, indicated by broken lines, of the dry resist laminate is obtained.

As soon as the first sensor 23 detects the leading edge 30 of the plate 5, it supplies signals to the holding-down means 6, 6 of the front and rear holding-down bars 7, 7, to the drive cylinder 2 of the cross-cutting means and to the motor for the longitudinal movement of the separating device 1. Each of the holding-down bars 7, 7 extends over the width of the strip 20 in front of and behind the cross-cutting means, as seen in the running direction A of the strip 20. The pneumatically actuated holding-down means 6, 6 are arranged on the insides of angle stops 32, 32 attached to the carriage 31 parallel to the two longitudinal sides of the strip 20. Each of the two holding-down bars 7, 7 is connected at its ends to the pneumatically actuated holding-down means 6, 6 which, when signals are received from the first sensor 23, press the holding-down bars 7, 7 against the strip 20 or against the plate located under it and this plate against the upper surface of the carriage 31. If the sensor 23 does not supply any signal, the holding-down means 6, 6 lift the holding-down bars 7, 7 off from the strip 20 or the plate. So that the holding-down bars 7, 7 can be moved up and down, slots 34 are provided in the vertical legs of the angle stops 32, 32. One of these slots 34 is shown in FIG. 1.

Figure 2:
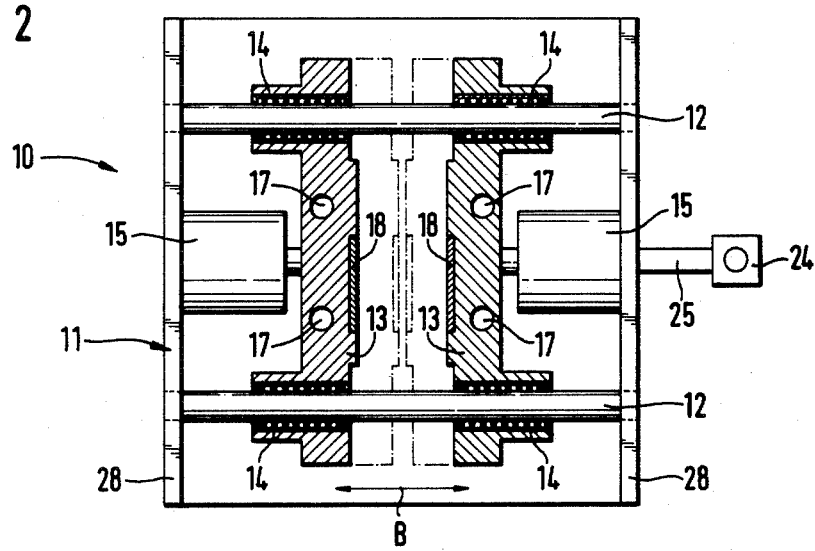
FIG. 2 is a sectional view from the bottom of the cross-cutting means according to the invention.

The mounting 11 of the cross-cutting means 10 is made U-shaped and has two legs 28, 28, (FIG. 2) in which two guide pins 12, 12 are mounted by means of their ends. The cross-cutting means 10 comprises two knife-holders 16, 16 (FIG. 4) with knives 18, 18 parallel to one another. The knife-holders 16, 16 are movable apart from one another and together, and during the transverse movement of the cross-cutting means 10 over the strip 20 (FIG. 1) the knives 18, 18 situated parallel to one another make a double cut simultaneously along the trailing and leading edges 29 and 30 respectively of the adjacent plates 4 and 5 and sever the dry resist laminate which connects the two plates. Each knife-holder (FIG. 2) is connected to an associated guide part 13 equipped on both sides with spherical bushings 14, 14. The spherical bushings 14, 14 run on the two guide pins 12, 12. Each guide part 13 is connected at its center to a guide cylinder 15 which is actuated pneumatically and which pushes the guide part 13 too and fro along the guide pins 12, 12 by means of its spherical bushings 14, 14. In FIG. 2, the position of the two guide parts 13 moved apart from one another is indicated by unbroken lines, while the position of the two guide parts moved together is represented by dot-and-dash lines.

The double arrow B indicates the moving of the two guide parts 13, 13 apart from one another and together. A second sensor 24 is fastened by means of an angle arm 25 to one leg 28, the right-hand leg in FIG. 2. Each guide part 13 has two holes 17, 17 which are symmetrical relative to the center of the individual guide part.

Figure 5:
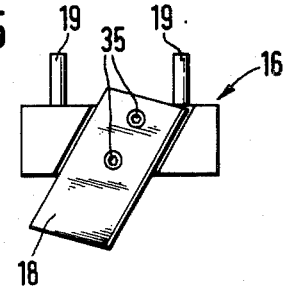
FIG. 5 is a detail view of the cross-cutting means, illustrating a knife-holder and a knife.

As is evident from FIG. 5, each knife-holder 16 is equipped with two cotter pins 19, 19 which are inserted into the holes 17, 17 (FIG. 2) in the associated guide part 13. The cotter pins 19, 19 are fixed in their inserted position in the holes 17, 17 by means of grub screws (not shown). The knife 18 is fastened obliquely in a recess of the knife-holder 16 by means of two counter-sunk hexagon socket screws 35. As a result of this design, it is very simple to exchange the knives 18, since it is merely necessary to release the plug connection between the knife-holder 16 and the guide part 13 by pulling out the knife-holder 16, and subsequently the knife 18 can be changed after the two hexagon socket screws 35 have been removed.

Figure 3:
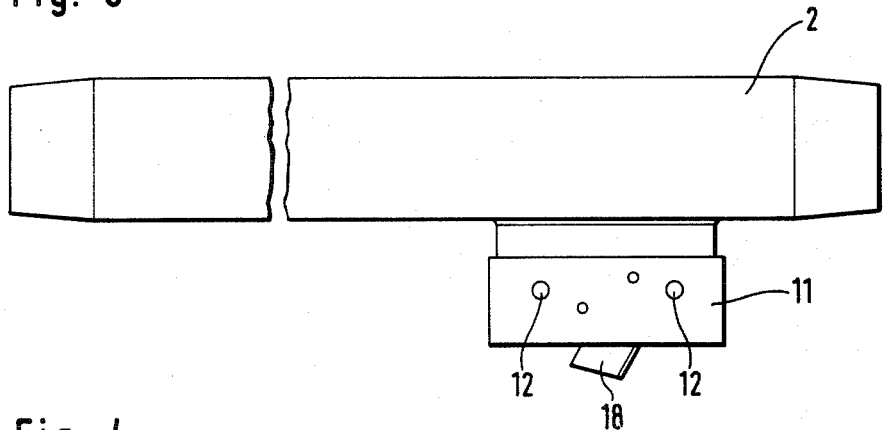
FIG. 3 is a side view of a drive cylinder for the mounting of the cross-cutting means.
Figure 4:
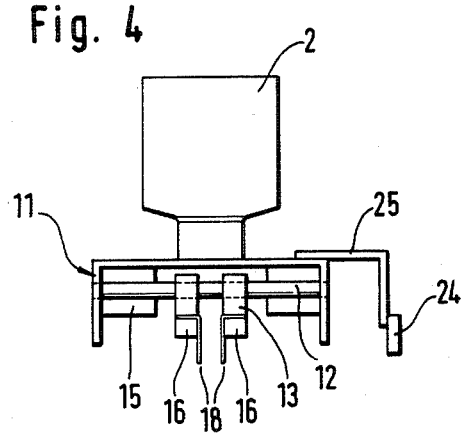
FIG. 4 is a front view according to FIG. 3.

FIGS. 3 and 4 show a side view and a front view of the drive cylinder 2 and of the mounting 11 together with the cross-cutting means 10. FIG. 4 illustrates the angle arm 25 attached to the first U-leg 28 and having the second sensor 24 for detecting a side edge of the plate 4 or 5. The second sensor 24 supplies signals to the drive cylinder 2 and the guide cylinders 15, 15 of the guide parts 13, 13, as soon as the side edge of the plate is detected by the sensor 24. In FIG. 4, the knife-holders 16 are not moved together completely, and the knives 18 are at a distance from one another.

The separating device 1 works as follows:

When a first plate 4 enters the separating device 1, the first sensor 23 is blocked. As soon as a second plate 5 enters, the sensor 23 is ready to operate and detects the leading edge of the plate 5 when the latter cuts through the light beam directed on the sensor 23. The sensor 23 supplies signals to the holding-down means 6, 6 which press the holding-down bars 7, 7, located transversely to the running direction A of the plates 4 and 5, against the plates 4 and 5 in order to retain these. Furthermore, the sensor 23 transmits signals to the drive cylinder 2, on which is fastened the mounting 11 together with the cross-cutting means 10 which, in response to the signals, is moved slowly forward in the running direction A out of its initial position. The motor (not shown) for the back-and-forth movement of the separating device 1 in the running direction A likewise receives signals from the sensor 23 and moves the carriage 31 of the separating device 1 along the spherical guides 8, 8 in the running direction A in synchronism with the plate speed. This movement continues until the second sensor 24 detects a side edge of the plate 5 which has previously been aligned. The second sensor 24 stops the drive cylinder 2 and moves the knife-holders 16, 16 apart from one another until the knives 18, 18 rest against the trailing edge 29 of the plate 4 and against the leading edge 30 of the plate 5. During this operation, the knife-holders 16, 16 are located in the region of the left-hand margin 21 of the strip 20 in FIG. 1.

With a delay of approximately 1/10 of a second, the drive cylinder 2 then moves the knife-holders 16, 16 transversely over the strip 20 in rapid motion, and the double cut is made flush along the trailing edge 29 and the leading edge 30. The mounting 11 moves to the right in FIG. 1 up to a stop (not shown), and when it touches the stop, guide cylinders 15, 15 of the guide parts 13, 13 of the knife-holders 16, 16 are reversed, so that the knife-holders 16, 16 move together. The cross-cutting means 10 is then moved back in rapid motion into its initial position at the right-hand margin 21 of the strip 20.

The carriage 31 of the separating device 1 is moved forward up to the first limit switch 26 which is actuated and which releases the holding-down means 6,6, lifting the holding-down bars 7, 7 off from the plates 4 and 5. At the same time, the motor is reversed and the carriage 31 is moved back into its initial position in rapid motion. At the same time, the first sensor 23 is blocked since it travels over the plate 5 and therefore must not transmit any signal. In the initial position of the carriage 31, the second limit switch 27 is actuated, stopping the motor and making the first sensor 23 ready for operation again by clearing it. The separating device 1 is then ready for a new cutting operation.

What is claimed is:

1. A separating device for plates being conveyed in a machine direction, said plates being arranged at a distance from one another in the machine direction and onto which at least one continuous strip composed of a dry resist layer has been laminated, comprising:
    (a) a carriage for guiding said strip and said plates in the machine direction;
    (b) a cross-cutting means mounted over said carriage, said cross-cutting means comprising a pair of cutting members spaced apart from and parallel to one another in the machine direction;
    (c) a means for moving said cross-cutting means in a direction transverse to the machine direction;
    (d) means for moving said carriage in the machine direction in response to movement of said strip; and
    (e) means for simultaneously severing the strip along the respective trailing and leading edges of two adjacent plates, including means for moving said cutting members with respect to one another in the machine direction, and means for automatically positioning one of said cutting members adjacent said trailing edge and one of said cutting members adjacent said leading edge of said adjacent plates in response to the distance between said adjacent plates prior to activation of said means for moving said cross-cutting means.

2. The separating device claimed in claim 1, wherein said cross-cutting means is mounted on mountings comprised of pillars.

3. The separating device as claimed in claim 1, wherein the cutting members comprises two knife-holders and two knives which are positioned parallel to one another, and wherein said means for moving said cutting members comprises means for moving said two knives apart from one another and toward one another.

4. The separating device as claimed in claim 1, further comprising in the region of the cross-cutting means a first sensor for supplying a signal in response to detection of the leading edge of each plate, said signal being supplied to said means for moving said cross-cutting means and to said means for moving said carriage.

5. A separating device as claimed in claim 2, wherein said means for moving said cross-cutting means includes a drive cylinder comprising a pneumatic cylinder having a band drive damped adjustably on both sides.

6. The separating device as claimed in claim 3, wherein said cross-cutting means includes an inverted U-shaped holder mounted for movement by said transverse moving means.

7. The separating device as claimed in claim 5, wherein the end faces of said drive cylinder are attached to fastening plates which are connected to said pillars.

8. The separating device as claimed in claim 4, further comprising a plurality of holding-down bars extending over the width of said strip respectively in front of and behind said cross-cutting means.

9. The separating device as claimed in claim 8, wherein each of the holding-down bars is connected at its ends to pneumatically actuated holding-down means for selectively pressing said holding-down bars against said strip and said strip against the upper surface of the carriage, and wherein said holding-down means are arranged on the insides of angle stops attached to said carriage parallel to the two longitudinal sides of said strip.

10. The separating device as claimed in claim 6, wherein said means for moving said knives comprises two guide pins mounted in spaced relationship in said U-shaped holder, individual guide parts having on both ends spherical bushings which run on said guide pins, and a guide cylinder for moving each of said guide parts back and forth along said guide pins, and wherein each of said knife-holders includes means for attaching said knifeholders to said individual guide parts.

11. The separating device as claimed in claim 10, further comprising an angle arm arranged on one side of said U-shaped holder, and attached to said angle arm a second sensor for supplying signals to said guide cylinders in response to detecting a side edge of said plates.

12. The separating device as claimed in claim 8, wherein said carriage rests on linear spherical guides arranged parallel on both sides of said strip and said carriage moving means includes a motor.

13. The separating device as claimed in claim 12, further comprising a first limit switch arranged near a first end of one of said spherical guides and arranged for actuation by the end face of said carriage for releasing said holding-down means.

14. The separating device as claimed in claim 12, further comprising near a second end of one of said spherical guides a second limit switch for stopping the motor and clearing the first sensor.

15. The separating device as claimed in claim 12, wherein said linear spherical guides are cylindrically shaped guides.

16. A separating device for plates being conveyed in a machine direction, said plates being arranged at a distance from one another in the machine direction and onto which at least one continuous strip composed of a dry resist layer has been laminated, comprising:
 (a) a carriage for guiding said strip and said plates in the machine direction;
 (b) a cross-cutting means mounted over said carriage, wherein the cross-cutting means comprises two knife-holders and two knives which are positioned parallel to one another, and which further comprises means for moving said two knives apart from one another and toward one another in response to the distance between the plates in order to sever the strip along the respective trailing and leading edges of two adjacent plates;
 (c) a means for moving said cross-cutting means in a direction transverse to the machine direction;
 (d) means for moving said carriage in the machine direction is response to movement of said strip, said carriage moving means including a motor;
 (e) in the region of the cross-cutting means, a first sensor for supplying a signal in response to detection of the leading edge of each plate, said signal being supplied to said means for moving said cross-cutting means and to said means for moving said carriage;
 (f) a plurality of holding-down bars extending over the width of said strip respectively in front of and behind said cross-cutting means;
 (g) linear cylindrical guides arranged parallel on both sides of said strip and on which said carriage is supported; and
 (h) near a second end of one of said cylindrical guides a second limit switch for stopping the motor and clearing the first sensor.

17. A separating device for plates being conveyed in a machine direction, said plates being arranged at a distance from one another in the machine direction and onto which at least one continuous strip composed of a dry resist layer has been laminated, comprising:
 (a) a carriage for guiding said strip and said plates in the machine direction;
 (b) a cross-cutting means mounted over said carriage, wherein the cross-cutting means comprises two knife-holders and two knives which are positioned parallel to one another, and which further comprises means for moving said two knives apart from one another and toward one another in response to the distance between the plates in order to sever the strip along the respective trailing and leading edges of two adjacent plates;
 (c) a means, including a drive cylinder, for moving said cross-cutting means in a direction transverse to the machine direction, and wherein said cross-cutting means further includes an inverted U-shaped holder mounted for movement by said moving means for said cross-cutting means; and
 (d) means for moving said carriage in the machine direction in response to movement of said strip, wherein said means for moving said knives comprises two guide pins mounted in spaced relationship in said U-shaped holder, individual guide parts having on both ends spherical bushings which run on said guide pins and a guide cylinder for moving each of said guide parts back and forth along said guide pins, and wherein each of said knife-holders includes two cotter pins by means of which said knife-holders can be inserted into holes which are in said individual guide parts.

18. The separating device as claimed in claim 17, further comprising an angle arm arranged on one side of said U-shaped holder, and attached to said angle arm a second sensor for supplying signals to said drive cylinder and said guide cylinders in response to detecting a side edge of said plates.

* * * * *

UNITED STATES PATENT AND TRADEMARK OFFICE
CERTIFICATE OF CORRECTION

PATENT NO. : 4,785,698

DATED : November 22, 1988

INVENTOR(S) : Martin STORK

It is certified that error appears in the above-identified patent and that said Letters Patent is hereby corrected as shown below:

Claim 1, line 10, after "from" insert --one another--; after "to" delete "one";
        line 11, delete "another in" and insert --a plane extending transverse to--;
        line 18, before "means" insert --guide cylinder--;
        line 20, delete "automatically"; before "means" insert --sensor--.

Signed and Sealed this

Sixth Day of March, 1990

Attest:

JEFFREY M. SAMUELS

Attesting Officer     Acting Commissioner of Patents and Trademarks